(12) United States Patent
Kobayashi et al.

(10) Patent No.: US 6,221,788 B1
(45) Date of Patent: Apr. 24, 2001

(54) SEMICONDUCTOR AND A METHOD FOR MANUFACTURING AN OXIDE FILM ON THE SURFACE OF A SEMICONDUCTOR SUBSTRATE

(75) Inventors: Hikaru Kobayashi; Kenji Yoneda; Takashi Namura, all of Kyoto (JP)

(73) Assignees: Matsushita Electronics Corporation, Osaka; Hikaru Kobayashi, Kyoto, both of (JP)

( * ) Notice: Subject to any disclaimer, the term of this patent is extended or adjusted under 35 U.S.C. 154(b) by 0 days.

(21) Appl. No.: 09/213,626

(22) Filed: Dec. 18, 1998

Related U.S. Application Data

(62) Division of application No. 08/690,910, filed on Aug. 1, 1996, now abandoned.

(30) Foreign Application Priority Data

Aug. 1, 1995 (JP) .................................................. 7-196726

(51) Int. Cl.⁷ .................................................. H01L 21/44
(52) U.S. Cl. ...................... 438/762; 438/579; 438/580; 438/650; 438/761; 438/770; 257/76
(58) Field of Search .............................. 257/76; 438/761, 438/762, 770, 579, 580, 650

(56) References Cited

U.S. PATENT DOCUMENTS

| | | |
|---|---|---|
| 4,526,629 | 7/1985 | Latta et al. . |
| 4,684,541 | 8/1987 | Franciosi . |
| 4,782,302 * | 11/1988 | Bastasz et al. .................. 324/71.3 |
| 4,806,505 | 2/1989 | Franciosi . |
| 5,274,586 * | 12/1993 | Matsukawa ...................... 365/149 |
| 5,516,725 * | 5/1996 | Chang et al. ...................... 437/177 |
| 5,552,623 | 9/1996 | Nishizawa et al. . |
| 5,656,827 * | 8/1997 | Kang et al. ........................ 257/76 |
| 5,719,422 | 2/1998 | Burr et al. . |

OTHER PUBLICATIONS

Riehl–Chudoba et al, "Promotion of the Oxidation of Silicon Carbide by a Rubidium, Overlayer", Journal of Applied Physics, vol. 76, No. 3, Aug. 1, 1994, pp. 1932–1934.

S.M. Sze, VLSI Technology, International Student Edition, 1983, pp. 131–167.

* cited by examiner

*Primary Examiner*—Charles Bowers
*Assistant Examiner*—Lisa Kilday
(74) *Attorney, Agent, or Firm*—Morrison & Foerster LLP

(57) ABSTRACT

The semiconductor of the present invention comprises at least an oxide film and a metal thin film on the surface of the semiconductor. The metal thin film includes a metal serving as an oxidation catalyst and has a thickness in the range of 0.5–30 nm. The oxide film comprises a metal serving as an oxidation catalyst and having a thickness in the range of 1–20 nm. Thus, a high-quality oxide film can be formed on the surface of the semiconductor substrate with high controllability without conducting a high temperature heat treatment. The invention employs the method of manufacturing the semiconductor has a steps of forming the first oxidation film having thickness in the range of 0.1–2.5 nm on the semiconductor substrate; forming the metal thin film (for example platinum film) serving as an oxide catalyst to the thickness in the range of 0.5–30 nm on the first oxide thin film; and then forming the second oxide film by heat treating in an oxidizing atmosphere at temperatures from 25 to 600° C.

14 Claims, 10 Drawing Sheets

SEMICONDUCTOR AND A METHOD FOR MANUFACTURING AN OXIDE FILM ON THE SURFACE OF A SEMICONDUCTOR SUBSTRATE

This application is a division of Ser. No. 08/690,910, filed Aug. 1, 1996, now abandoned.

FIELD OF THE INVENTION

The invention relates to a semiconductor which can be employed for MOS (metal oxide semiconductor) devices used for integrated circuits, more specifically, an ultra thin gate oxide film MOS transistor, an oxide film MOS capacitor or the like. The invention also relates to a method for manufacturing an oxide film on the surface of the semiconductor substrate.

BACKGROUND OF THE INVENTION

For semiconductor devices (generally silicon devices), more specifically, a gate oxide film MOS transistor, an oxide film MOS capacitor or the like; a silicon dioxide film (hereinafter oxide film is used for abbreviation) is used. These oxide films need to have a high dielectric breakdown voltage and a high charge to (dielectric) breakdown. Clearing the wafer is one of the very important processes in manufacturing an oxide film. It is required that the wafer be cleaned and have a high quality, that is, a low fixed charge density, and a low interface-state density. On the other hand, as devices become fine and highly-integrated, gate oxide films or capacitance oxide films are becoming thinner. For example, according to the design rule of 0.1 $\mu$m or less, an ultra thin gate oxide film having a thickness of not more than 4 nm is required. Conventionally, a gate oxide film of an MOS transistor has been formed by the method in which semiconductor substrate is exposed in an oxidizing atmosphere, for example, in an atmosphere of dry oxygen or in an atmosphere of steam, at a temperature of 600° C. or higher (See, for example, VLSI technology, S. M. Sze edition (1983) 131–168 page).

Moreover, other than thermal oxidation, the chemical vapor deposition method (CVD method) is employed, in which mono-silane is thermally decomposed to deposit on the surface of the substrate. Methods of growing an oxide film at a low temperature include the method of forming a chemical oxide film by soaking the semiconductor substrate in a chemical for promoting oxidation, such as nitric acid; and the method of forming an oxide film by anodic oxidation. However, in the case of chemical oxide films, the growth of film thickness is limited. On the other hand, in the case of anodic oxidation, the range of controllability of film thickness is relatively wide, but the electric characteristics such as, the interface characteristics, dielectric breakdown characteristics, or the like are not satisfactory. Other methods of forming oxide films at low temperature include the method of forming an oxide film by conducting a thermal oxidation by ultraviolet irradiation and the method of forming an oxide film by oxidizing in plasma. In the conventional methods mentioned above, it has been difficult to form high-quality thin films having high controllability and high reproducibility.

Moreover, thermal oxidation at relatively high temperature has the problem of a lack in controllability of (the film thickness during formation of an oxide film having a thickness of 4 nm or less. If oxidation is conducted at a low temperature in order to improve the controllability of the film thickness, there arise problems in the quality of the formed oxide film, that is, the interface-state density is high, the fixed charge density is high or the like. Moreover, an oxide film deposited by the CVD method has the same problems in the controllability and the quality of film. In particular, occurrence of an interface-state density not only deteriorates the hot-carrier immunities of a transistor, but also causes instability in the threshold voltage of the transistor and deterioration in mobility of carriers. In a case where a small device is employed, this may be a fatal problem. Moreover, it is required to decrease the heat treating process by making the element small. In particular, from the viewpoint of flexibility in designing devices and process, in the conventional method of forming a gate oxide film by the use of a thermal oxide film at a relatively high temperature, the gate oxide film needs to be formed before the metallic interconnection process is carried out. So far, in order to obtain a low resistance, aluminum or aluminum alloy has been used for the metallic interconnection. Since the melting point of aluminum is 660° C. and, moreover, hillocks (abnormal protrusions on the surface of an aluminum wiring taking place during heat treatment) may be occur, the heat treatment after metallic wiring is required to be conducted at a temperature not higher than 400° C. Therefore, in the case where the conventional thermal oxidation method is employed, it is difficult to form a gate oxide film after the metallic interconnection process. Moreover, in the case where an oxide film is formed by the heat treatment at a temperature of not higher than 400° C. for approximately one hour, the film thickness turns out to be not more than 1 nm, thus making it difficult to form a thin film usable for a gate oxide film.

SUMMARY OF THE INVENTION

An object of the present invention is to solve the above-mentioned problems of the conventional methods for manufacturing oxide films. In order to solve the problems, the present invention provides a semiconductor, on the substrate surface on which a high-quality oxide film with a controllability can be formed, and also a gate oxide film can be formed after metallic wiring. Another object of the present invention is to provide a method for manufacturing an oxide film on the surface of the semiconductor substrate.

In order to achieve the above-mentioned objects, the present invention provides a semiconductor comprising at least an oxide film and a metal thin film on the surface of a semiconuctor substrate. In the above-mentioned semiconductor, the metal thin film comprises a metal serving as an oxidation catalyst and having a thickness in the range of 0.5–30 nm, and the oxide film comprises a metal serving as an oxidation catalyst and having a thickness in the range of 1–20 nm.

It is preferable in the above-mentioned semiconductor of the present invention that an oxide film comprises a first oxide film and a second oxide film, and the first oxide film has a thickness in the range of 0.1–2.5 nm and the second oxide film has a thickness in the range of 0.9–18.5 nm.

It is preferable in the above-mentioned semiconductor of the present invention that the metal thin film serving as an oxidation catalyst comprises at least one metal selected from platinum and palladium.

It is preferable in the above-mentioned semiconductor of the present invention that the metal thin film serving as an oxidation catalyst be formed by the deposition method.

It is preferable in the above-mentioned semiconductor of the present invention that the semiconductor substrate comprises at least one material selected from the group consisting of single crystalline silicon, polycrystalline silicon, amorphous silicon, gallium arsenide and indium phosphide.

It is preferable in the above-mentioned semiconductor of the present invention that the thickness of the second oxide film is greater than that of the first oxide film and the thickness of the second oxide film ranges from 1 to 20 nm.

In addition, the method for manufacturing an oxide film on the surface of the semiconductor substrate of the present invention has steps of forming the first oxide film having a thickness in the range of 0.1–2.5 nm on the semiconductor substrate; forming the metal thin film serving as an oxidation catalyst and having a thickness in the range of 0.5–30 nm on the first oxide film; and forming the second thin film by heat treatment thereof in an atmosphere of oxidation at temperatures of not higher than 600° C.

It is preferable in the above-mentioned method that the first oxide film is manufactured by soaking the semiconductor substrate in at least one solution selected from the group consisting of following A to I;

A. a heated solution containing concentrated nitric acid,
B. a heated solution containing concentrated sulfuric acid and hydrogen peroxide,
C. a heated solution containing hydrochloric acid and hydrogen peroxide,
D. a solution containing hydrogen peroxide,
E. a solution containing ozone,
F. a heated solution containing nitric acid and sulfuric acid,
G. a solution containing hydrofluoric acid,
H. boiling water, and
I. a heated solution containing ammonium hydride solution and hydrogen peroxide.

The above-mentioned solutions A–I are suitable for oxidizing the semiconductor substrate, for example, a silicon substrate.

It is preferable in the above-mentioned method that the oxide film is form ed either by the method of exposing the semiconductor substrate to ozone gas, or by the method of exposing the semiconductor substrate to ozone gas with ultraviolet irradiation. It is preferable that this oxide film is formed in the vapor phase, so that contamination such as dust does not easily stick.

It is preferable in the above-mentioned semiconductor and the method for manufacturing an oxide film that the metal thin film serving as an oxidation catalyst comprises at least one material selected from platinum and palladium.

It is preferable in the above-mentioned semiconductor and the method for manufacturing oxide films that the metal thin film serving as an oxidation catalyst is formed by the deposition method.

It is preferable in the above-mentioned method that the heat treatment is conducted in an oxidizing atmosphere selected from the group consisting of the following a–g:

a. an atmosphere of dry oxygen,
b. an atmosphere of mixed gas containing dry oxygen and non-oxidizing gas,
c. an atmosphere of oxygen containing water vapor,
d. an atmosphere of mixed gas containing oxygen containing water vapor and non-oxidizing gas,
e. an atmosphere containing ozone gas.
f. an atmosphere of oxygen containing $N_2O$, and
g. an atmosphere of oxygen containing NO.

This oxidation treatment permits the efficient formation of the film.

It is also preferable in the above-mentioned method that the temperature of the heat treatment in an oxidizing atmosphere is in the range of 25–600° C.

It is also preferable in the above-mentioned method that the semiconductor substrate comprises at least one material selected from the group consisting of monocrystalline silicon, polycrystalline silicon, noncrystalline silicon, gallium arsenide and indium phosphide. By using the above-mentioned material for the semiconductor, the application of the semiconductor can be broadened.

It is also preferable in the above-mentioned method that the native oxide films and/or impurities which are present on the surface of the semiconductor substrate are removed before oxide films are formed. This treatment is conducted in order to clean the surface of the silicon substrate on which a high quality ultra thin oxide film is formed.

It is also preferable in the above-mentioned method that the thickness of the second oxide film is greater than that of the first oxide film, and the thickness of the second oxide film ranges from 1 to 20 nm. If the oxide film which can be resultingly obtained has the thickness in the range mentioned above, the oxide films are useful for MOS transistors, MOS capacitance ultra thin gate oxide films and capacity oxide films or the like.

According to the above-mentioned method the heat treatment in an oxidizing atmosphere may be conducted even after the metal wiring is placed on the surface of the semiconductor substrate.

According to the above-mentioned semiconductor of the present invention, the semiconductor comprises at least an oxide film and a metal thin film on the surface of a semiconductor substrate. Furthermore, the metal thin film comprises a metal serving as an oxidation catalyst and having a thickness in the range of 0.5–30 nm and the oxide film is made by a metal serving as an oxidation catalyst and having a thickness in the range of 120 nm. As a result, a high quality oxide film can be formed on the semiconductor substrate without conducting a high temperature heat treating with a high producibility. Furthermore, the semiconductor can be obtained which can form the gate oxide film after metal wiring is made.

According to the method for manufacturing the oxide film on the surface of the semiconductor substrate, the oxide film is manufactured by the steps of forming the first oxide film having a thickness in the range of 0.1–2.5 nm on the semiconductor substrate; forming the metal thin film serving as an oxidation catalyst and having a thickness in the range of 0.5–30 nm on the first oxide film; and heat treating in an oxidizing atmosphere at temperatures of not higher than 600° C. to form the second oxide film. Consequently, thin, homogeneous, and high-quality oxide films can be formed on the surface of the semiconductor substrate effectively and reasonably. In this method, high controllability can also be realized.

According to the method of-the present invention, a thin and homogeneous oxide film is formed on a clean surface of the semiconductor substrate and then the metal thin film serving as an oxidation catalyst is formed thereon, so that the semiconductor located right under the metal thin film can be oxidized at a low temperature of from room temperature (25° C.) to 600° C. By this case, the oxide film can easily be made to be a thin film of thickness of 1–20 nm. Moreover, the oxide film formed in the method of the present invention is excellent in its interfacial characteristics so that a high-quality oxide film can be obtained, which is low in interface-state density of the interface. The quality of the oxide film can be changed by the method of forming the oxide film as well as by the oxidation rate, the temperature of heat treatment and oxidizing atmosphere. Under the more preferable conditions of the present invention, semiconductor substrates can be oxidized at temperatures in the range of room temperature (25° C.) to 400° C.

BRIEF DESCRIPTION OF THE DRAWINGS

FIG. 1 (a) slows the process in which the separation region and an active region were formed on the silicon substrate;

FIG. 1 (b) shows the process of removing the native oxide film;

FIG. 1 (c) shows the process of forming the chemical oxide film (the first oxide film) on the surface of the silicon substrate;

FIG. 1 (d) shows the process of forming the platinum film as a metal film serving as an oxidation catalyst;

FIG. 1 (e) shows the process of forming a second oxidation silicon film which was heat treated in an atmosphere of oxidation;

FIG. 1(f) shows the process of forming an electrode film; and

FIG. 1(g) shows the process of forming a gate electrode.

DETAILED DESCRIPTION OF THE INVENTION

The invention will be explained in detail with reference to the attached figures and the following examples.

Figure 1:
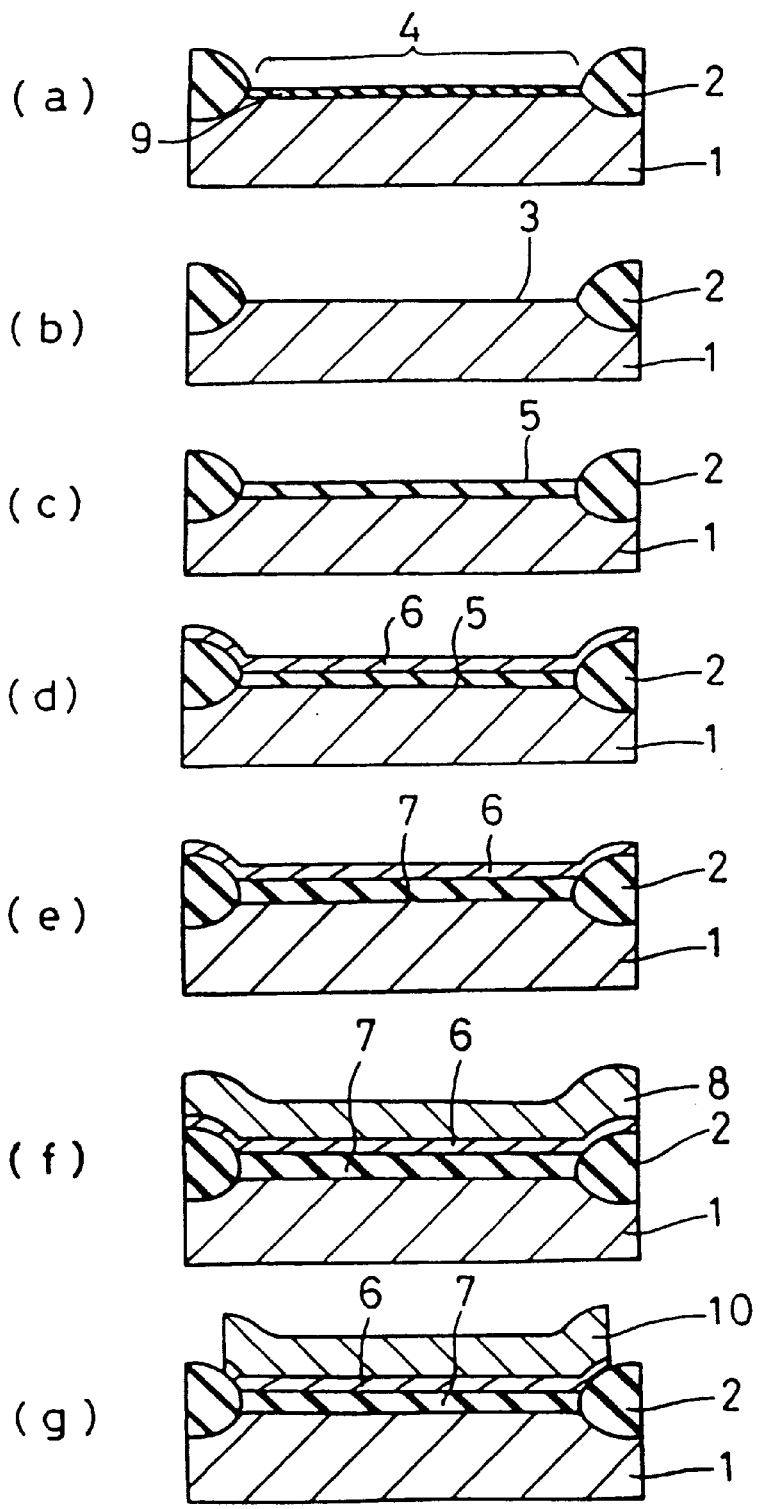
FIG. 1 shows process charts in which an MOS capacitor was formed by the oxidation method of semiconductor substrate of one example of the present invention.

First, referring now to FIG. 1, there is shown an example 1 of forming an oxide film of the present invention. In this example, the process of forming a MOS capacitor will be explained. In this example, a silicon substrate was used as an semiconductor substrate. Initially, a separation region 2 and an active region 4 were formed on the silicon substrate 1. On the surface of the active region 4, native oxide film 9 is provided (FIG. 1(a)). As a silicon substrate, p-type (100) having a resistivity of 10–15 Ωcm is employed. A channel stopper made of boron was injected thereon, thus forming LOCOS (local oxidation of silicon) oxide film t 500 nm thick.

The surface of the active region 4 was cleaned by the following steps; a wafer was cleaned by the well known RCA cleaning method (W. Kern, D. A. Plutien: RCA review 31 (1970) 187 page); and the wafer was soaked in a dilute HF solution (0.5 vol. % aqueous solution of hydrogen fluoride) for five minutes, so as to remove the native oxide film 9 on the surface of the silicon substrate (FIG. 1(b)). In order to form a high quality ultra thin oxide film on the surface of silicon, a clean silicon surface 3 is needed. It is important to perfectly remove the native oxide film 9 and impurities for the surface of silicon.

Then, the wafer was rinsed in ultra pure water for five minutes, and then soaked in the heated nitric acid at 115° C. for ten minutes so that a chemical oxide film 5 (the first oxide film) having a thickness of 1.1 nm was formed on the surface of the silicon substrate (FIG. 1(c)). According to this example, the thin oxide film 5 was formed by chemical treating or heat treating at a low temperature after the semiconductor substrate was cleaned to remove the native oxide films. The method of chemical treating the surface of the semiconductor is not limited to the method of the present invention of soaking the substrate in heated concentrated nitric acid. Such methods include a method of soaking a semiconductor substrate in a mixed solution containing sulfuric acid and hydrogen peroxide; a method of soaking a semiconductor substrate in a mixed solution containing hydrochloric acid and hydrogen peroxide; a method of soaking a semiconductor substrate in a mixed solution of aqueous ammonia and hydrogen peroxide water; and a method of soaking a semiconductor substrate in ozone water in which several tens of ppm of ozone is dissolved. In this example, a clean and high-quality chemical oxide film containing no heavy metal was formed by using the heated concentrated nitric acid. Moreover, other than the above-mentioned methods, a method of heat treating in an oxygen from room temperature (25° C.) to 400° C., a method of exposing a wafer in an atmosphere of ozone gas and at the same time heat treating at a temperatures from the room temperature to 400° C., or a method of exposing a wafer in an atmosphere of ozone gas with ultraviolet irradiation can be employed.

Removing the native oxide film 9 of above-mentioned explanation is important for the characteristics of the first oxide film 5. In other words, the clean and homogeneous oxide film is required. After the heavy metal and the native oxide film were removed from the surface, by further employing ozone gas, an ultra clean and thin protective coating oxide film could be formed to provide the ultra clean surface of the wafer.

Then, as a metal film serving as an oxidation catalyst, platinum film 6 having a thickness of approximately 3 nm was deposited onto the first oxide thin film 5 on the silicon substrate by the electron beam deposition method (FIG. 1(d)). In this case, platinum with a purity of 99.99 wt. % was used. The deposition rate was controlled to be 0.3 nm/min.; the temperature of the silicon substrate during deposition was 50° C.; and the deposition pressure in the atmosphere was $1\times40^{-4}$ Pa.

The silicon substrate was heat treated in moistened oxygen at a temperature of 300° C. by the use of an electric furnace for one hour so that the silicon oxide film 7 grew to be 4.5 nm thick (FIG. 1(e)). Consequently, the oxide film 7 having a thickness of 4.5 nm and the platinum film 6 having a thickness of 3 nm were formed on the silicon substrate 1. As a metal film serving as an oxidation catalyst, palladium may also be used. The oxide film 7 can be used as a gate oxide film.

An electrode was formed as following steps of; depositing an aluminum 8 at 1μm thick by the sputtering method (FIG. 1(f)); patterning a gate electrode by the well known photo-lithographic method; and forming a gate electrode 10 by etching an aluminum and a platinum by the well known dry etching method (FIG. 1(g)). In this example, the platinum film serving as an oxidation catalyst was used as a portion of an electrode, however, a conductive film may be used for a gate electrode after platinum is removed with aqua regia or the like.

Figure 2:
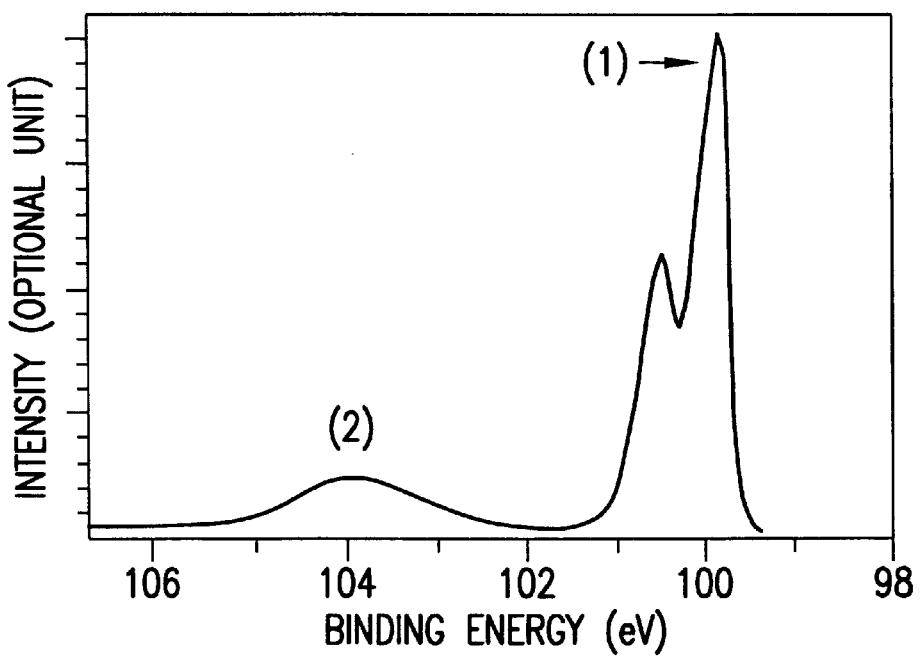
FIG. 2 shows the X-ray photo-electron spectrum which was observed after the silicon substrate was cleaned to remove native oxide films formed thereon and soaked in a heated concentrated nitric acid.

FIG. 2 shows an X-ray photo-electron spectrum which was observed after the silicon substrate was cleaned to remove native oxide films formed thereon and soaked in heated concentrated nitric acid. The X-ray photo-electron spectrum was measured by means of ESCALAB 220i-XL (product by VG). In this example, for the source of X-rays, Kα-ray of Al having an energy of 1487 eV was used. The photo electrons were observed in the perpendicular direction. A peak (1) occurred due to the photo-electron from the 2p track of Si of the silicon substrate; a peak (2) occurred due to the photo-electron from the 2p track of Si of the silicon oxide film. The thickness of silicon oxide film could be calculated from the ratio of the integrated intensity of peak (2) to peak (1) so that the thickness was 1.1 nm. The mean free path of the 2p track of Si in the silicon oxide film was made to be 2.7 nm, a mean free path of the silicon substrate was 2.6 nm. (See R. FLITSCH AND S. I. Raider, Journal of the Vacuume Science and Technology (J. Vac. Sci. Tehcnol.) Vol.12 (1975), page 305).

Figure 3:
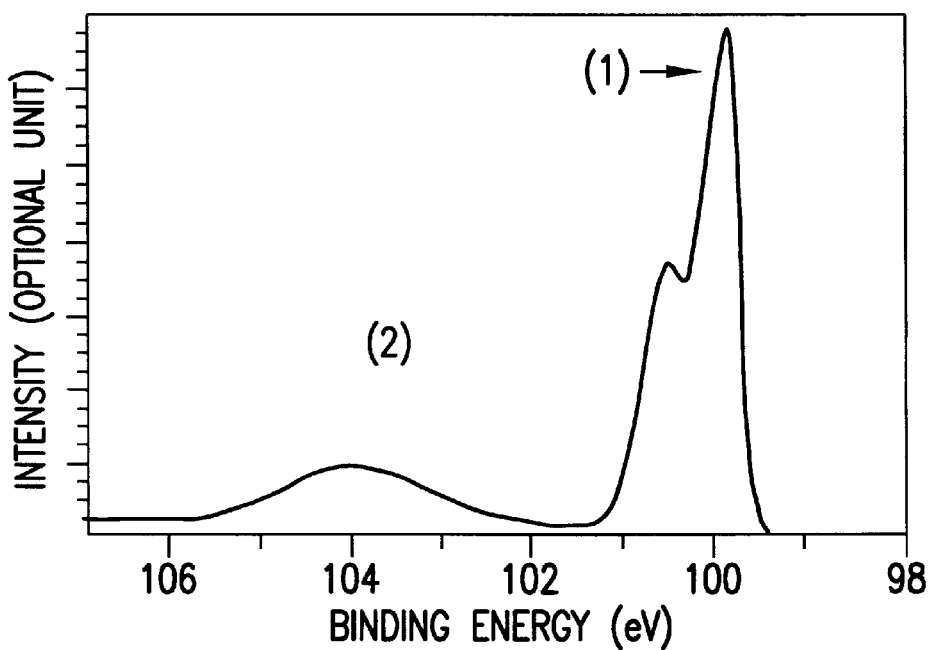
FIG. 3 shows the X-ray photo-electron spectrum which was observed after the silicon oxide film was formed by concentrated nitric acid and then the produced sample was put into an electric furnace and heat treated at the temperature of 300° C. in the moistened oxygen.

FIG. 3 shows an X-ray photo-electron spectrum which was observed after the silicon oxide film was formed by the concentrated nitric acid and then the produced sample was put into the electric furnace and heated therein at a temperature of 300° C. in moistened oxygen for one hour. The ratio of the integrated intensity of peak (1) to peak (2) was almost the same as those in FIG. 2. As a result, the thickness of the silicon oxide film was not observed to change due to the heat treatment in an oxidizing atmosphere at a low temperature of 300° C. This shows that the conventional thermal oxidation method conducted at a low temperature of 300° C. cannot grow a silicon oxide film to the thickness (2–6 nm) which is the minimum possible thickness for gate oxide film of MOS transistor.

Figure 4A:
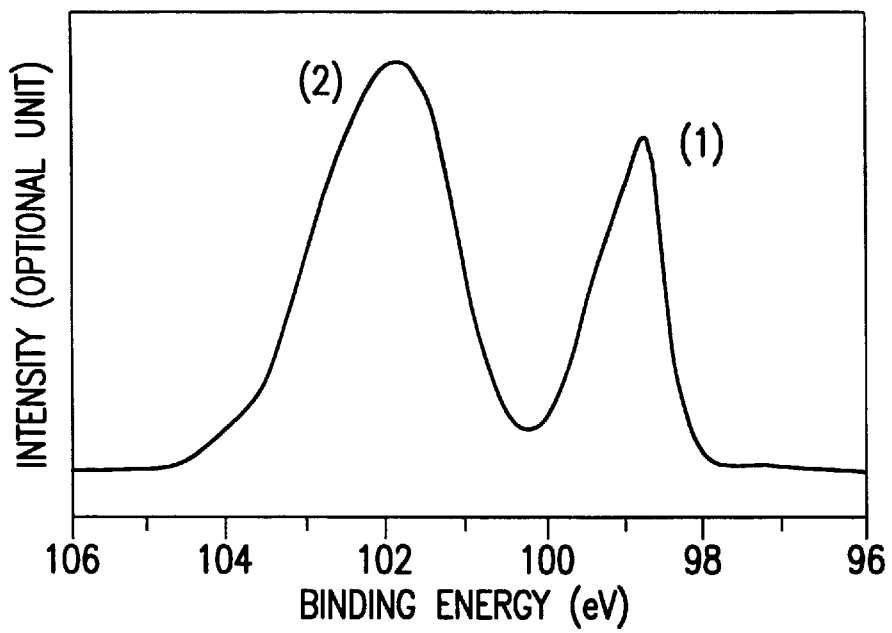
FIG. 4(a), and FIG. 4(b) show the X-ray photo-electron spectrum which was observed after the silicon oxide film was formed by heated concentrated nitric acid, platinum was deposited by an electric beam method and the produced sample was put into the electric furnace and heat treated at the temperature of 300° C. in moistened oxygen.
Figure 4B:
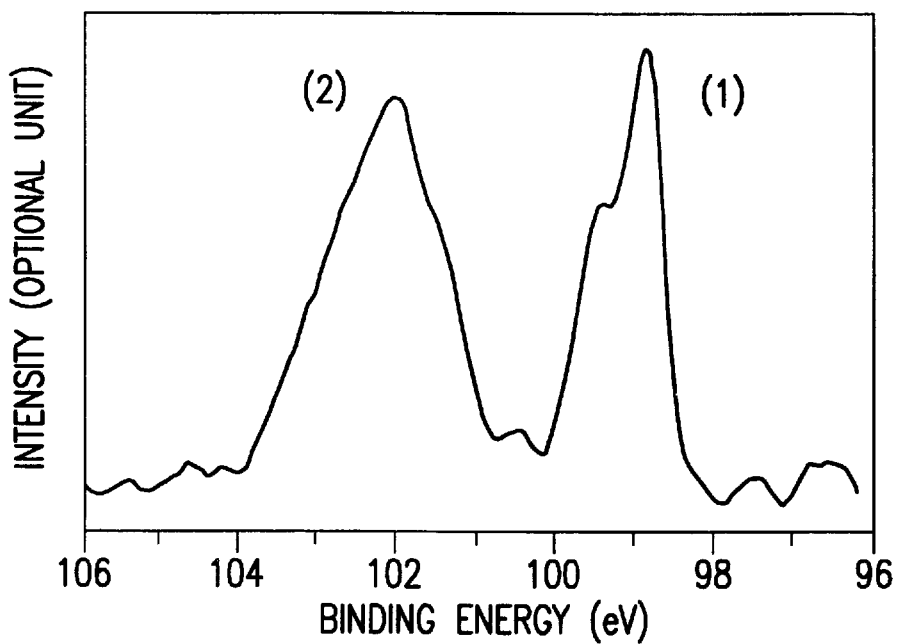

FIG. 4(a) shows an X-ray photo-electron spectrum which was observed after the silicon oxide film was formed by heated concentrated nitric acid, a platinum film having a thickness of approximately 3 nm was deposited thereon, the produced sample was put into the electric furnace and heated at a temperature of 300° C. in moistened oxygen for one hour. The X-ray photos-electron spectrum was measured by means of ESCA 1000 (product by SHIMADZU CORPORATION). FIG. 4(b) shows an X-ray photo-electron spectrum of FIG. 4(a) measured by means of ESCALAB 220i-XL (product by VG). In this example, for the source of X-rays, a Kα-ray of Mg having an energy of 1254 eV was used. The peak (2) intensity of silicon oxide film was increased and silicon oxide film was observed to grow. The thickness of silicon oxide film was 4.5 nm according to the calculation from the ratio of the integrated intensity of the peak (2) to peak (1) shown in FIG. 4. In other words, if a platinum thin film was present on the silicon oxide thin film, the silicon thin film can be observed to grow at a low temperature of approximately 300° C.

Figure 5:
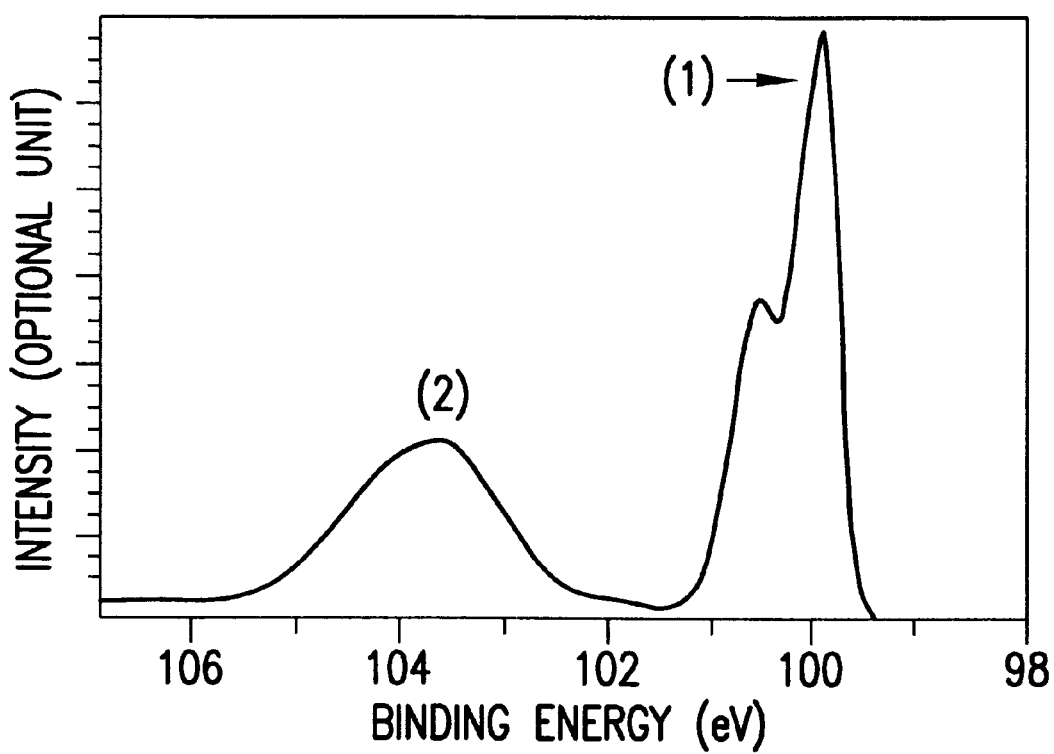
FIG. 5 shows the X-ray photo-electron spectrum which was observed after the silicon oxide film was formed by heated concentrated nitric acid, platinum was deposited thereon by an electric beam method, and the produced sample was put into the electric furnace and heat treated at room temperature in moistened oxygen.

FIG. 5 shows an X-ray photo-electron spectrum which was observed after the silicon oxide film was formed by heated concentrated nitric acid, a platinum film having a thickness of approximately 3 nm was deposited thereon, the produced sample was put into the electric furnace and heated at room temperature in moistened oxygen for one hour. When compared with FIG. 4(a) and FIG. 4(b), the peak (2) occurred due to the photo-electron from the 2p track of Si of the silicon oxide film was lower. However, when compared with peak (2) shown in FIG. 3, which occurred after the silicon oxide film was formed by the concentrated nitric acid and then the produced sample was put into the electric furnace without depositing platinum on the surface of the silicon substrate and heated therein at a temperature of 300° C. in moistened oxygen for one hour, the peak (2) of FIG. 5 was higher. As a result, silicon oxide film was recognized to grow even at room temperature.

Figure 6:
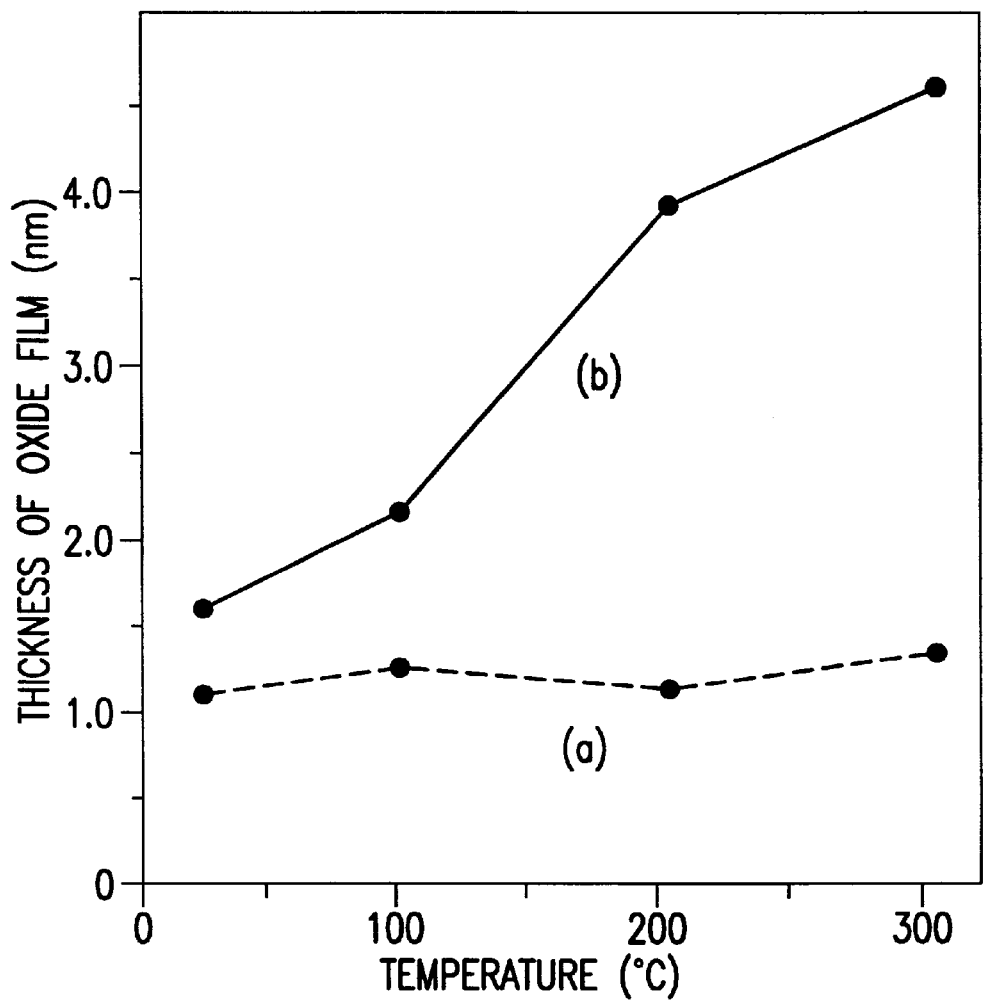
FIG. 6 is a graph showing the relation between the thickness of oxide film formed in one example of the present invention and the temperature of oxidation.

FIG. 6 shows the plots of the relation between the thickness and the heated temperature of a silicon oxide film. Plot (a) shows a thickness of an oxide film calculated from the ratio of the integrated intensity of the X-ray photo-electron spectrum which was measured after a silicon oxide film was formed by soaking a silicon wafer in heated concentrated nitric acid, then the produced sample was put into the electric furnace and heated at various temperatures in an atmosphere of moistened oxygen for one hour. Plot (b) shows the thickness of an oxide film calculated from the ratio of the integrated intensity of the X-ray photo-electron spectrum which was observed after a silicon oxide film was formed by soaking a silicon wafer in heated concentrated nitric acid, then a platinum film having the thickness of approximately 3 nm was deposited thereon by the electric beam evaporation method, and then the produced sample was put in the electric furnace and heated at various temperatures in moistened oxygen for one hour. The thickness of the silicon oxide film was estimated from the X-ray photo-electron spectrum of the 2p region of Si. Plot (a) shows that in a case where a platinum thin film was not present on the silicon oxide film, the thickness of the silicon oxide film did not change by heat treating at a low temperature of not higher than 300° C. The change in the thickness is within the range of experimental error. On the other hand , plot (b) shows that in cases where a platinum thin film was present on the silicon oxide film, a silicon oxide film can be observed to grow by the heat treatment at a low temperature.

Figure 7:
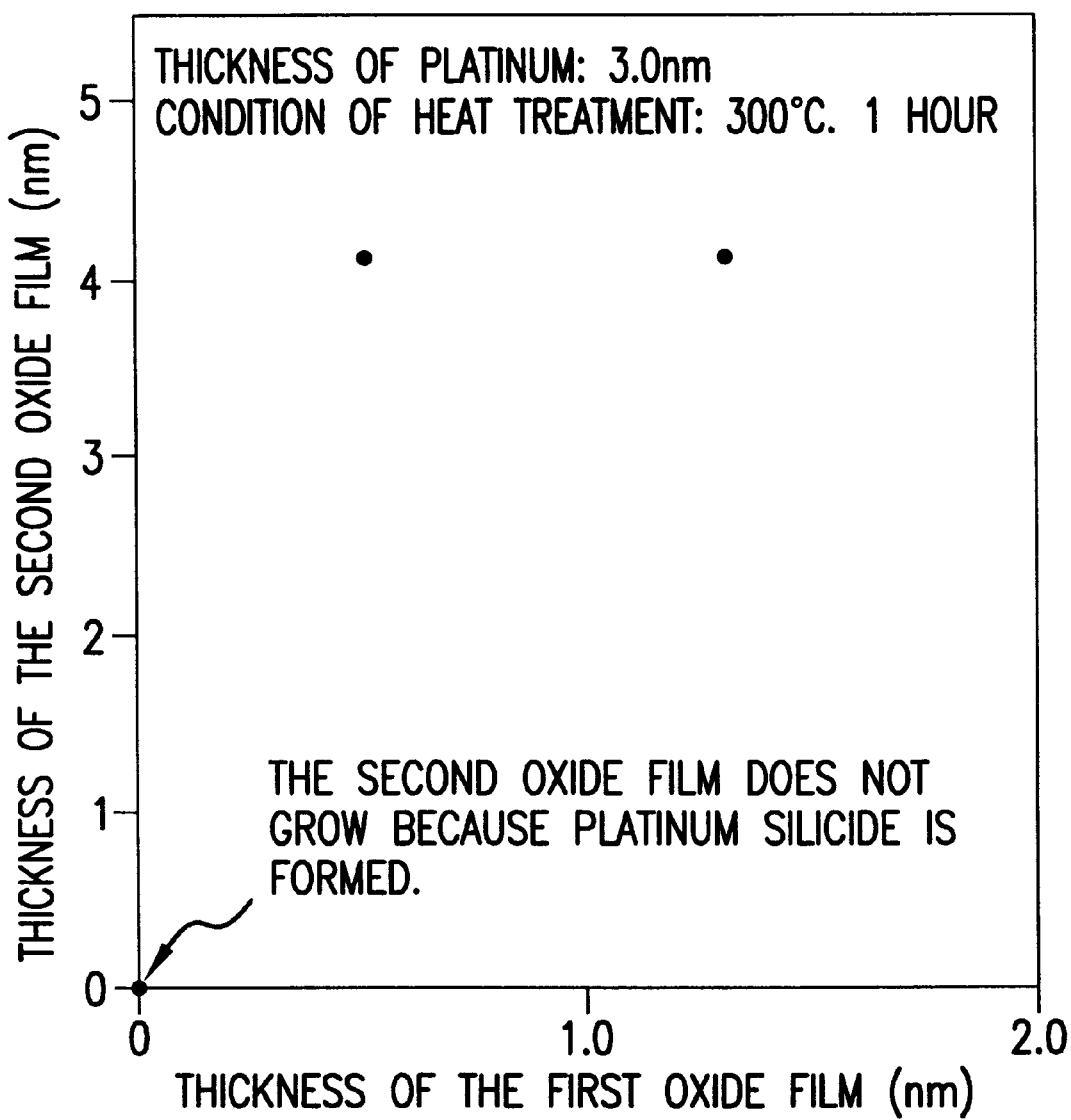
FIG. 7 shows the relation between the thickness of oxide film and that of the first oxide film formed by the method of one example of the present invention.

FIG. 7 shows the dependency of the second oxide film on the first oxide film. The second oxide film was formed by the heat treatment which was carried out after platinum was deposited on the first oxide film. The first oxide film was formed before platinum was deposited. The surface of a silicon wafer was cleaned and then etched by the 1 vol. % hydrogen fluoride (HF) aqueous solution to form a first oxide film. In addition, the silicon wafer was soaked for 10 minutes in a heated mixed solution in which hydrogen acid, hydrogen peroxide and ultra pure water were mixed at the ratio of 1:1:1.5 to grow the first oxide film to 0.5 nm thickness. In order to obtain the 1.3 nm thick first oxide film the silicon wafer was soaked in the heated concentrated nitric acid for ten minutes at the temperature of 115° C. A 3 nm thick platinum film was deposited on these oxide films and heat treated at the temperature of 300° C. in moistened oxygen for one hour to form the second oxide film. In the case where the thickness of the first oxide film was 0 nm, the second oxide film could not grow at all. In this case, platinum silicide was generated at the interface of the silicon substrate by a reaction between the silicon substrate and the platinum. However, only if the first oxide film was controlled to 0.5 nm, there was no reaction occurred between the platinum and silicon. Consequently, the 4.2 nm thick second oxide film could be provided. In the case where the first oxide film was 1.3 nm, the thickness of the second oxide film was 4.2 nm. The first oxide film has an important function of preventing a reaction between the platinum and silicon as well as promoting the growth of the second oxide film. According to the present invention, if the thickness of the first oxide film is 0.1 nm or more, a reaction between platinum and silicon can be prevented. However, if the thickness of the first oxide film is 0 nm, the silicide reaction occurs between platinum and silicon. On the other hand, in the case where the thickness of the first oxide film was great, as is apparent from FIG. 7, the thickness of the second oxide film when the first oxide film is 0.5 nm is not so different from the thickness of the second oxide film when the first oxide film is 1.3 nm. Even if the thickness of the first oxide film was increased, much increase of the thickness of the second oxide film cannot be expected. Moreover, if the thickness is made to be extremely great, the object of obtaining the thin oxide film cannot be satisfied. Therefore, the upper limit of the first oxide film is approximately 2.5 nm.

Figure 8:
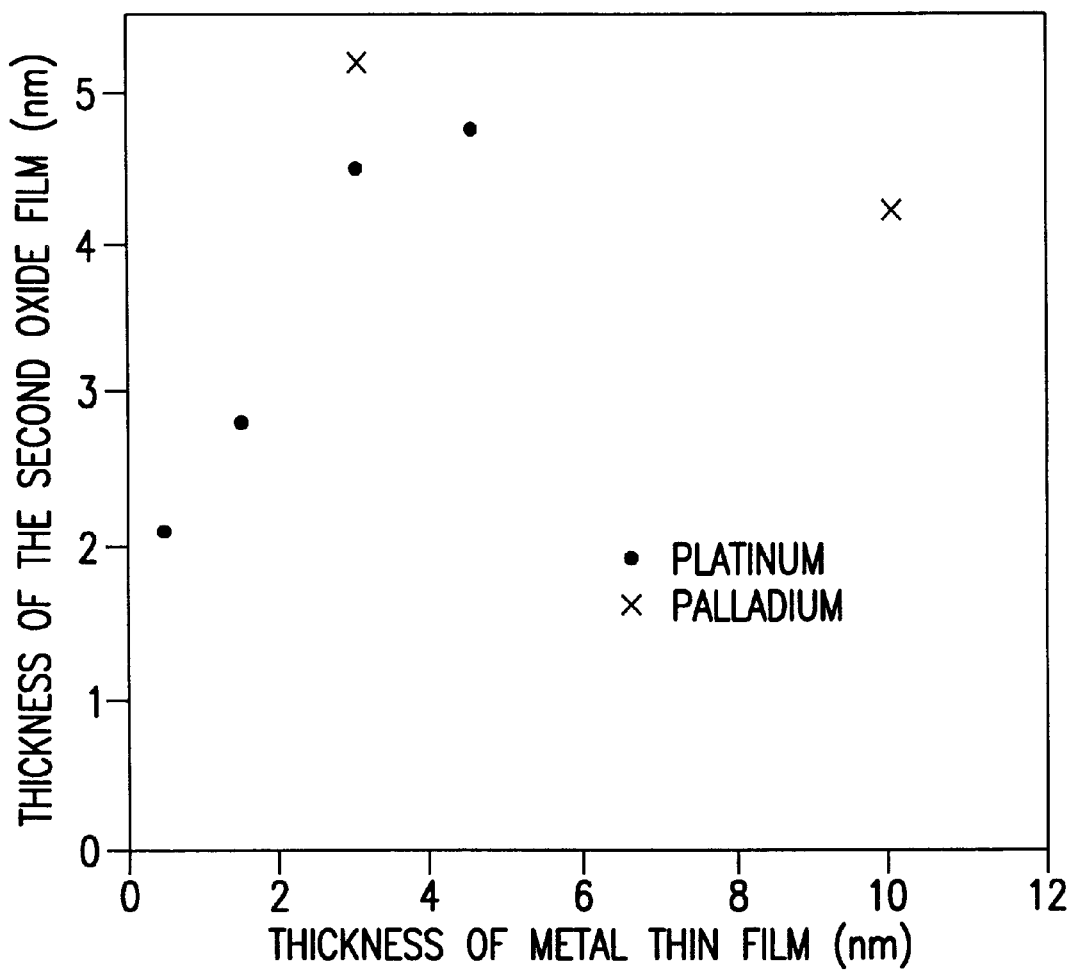
FIG. 8 shows the relation between the thickness of the oxide film and that of the platinum film or palladium film formed by the method of one example of the present invention.

FIG. 8 shows the relation between the thickness of the second oxide film (formed by the heated concentrated nitric acid) and the thickness of platinum. In FIG. 8, the result when palladium was employed instead of platinum was also shown. In the case where the thickness of platinum was 0 nm (no platinum was deposited), the second oxide film did not grow, which was same as in FIG. 3. In the case where platinum was deposited to 0.5 nm thickness, a thickness of the second oxide film became 2.1 nm. As the thickness of platinum was increased, the thickness of the second oxide film changes as follows. When the platinum was deposited to 1.5 nm thickness, the thickness of the second oxide film was 2.8 nm; when the platinum was deposited to 3 nm thickness, a thickness of the second oxide film was 4.5 nm; when the platinum was further deposited to 5 nm, a thickness of the second oxide film decreased to 4.2 nm; and when the thickness of platinum was further increased, a thickness of the second oxide film decreased. According to the present invention, in order to efficiently form the oxide film, the upper limit of the thickness of platinum was 30nm. In the case where palladium was employed instead of platinum, when palladium was deposited to 3 nm thickness, the thickness of the second oxide film grew to be 5.2 nm. However, when the palladium was 10 nm, the second oxide film decreased to 4.2 nm. In the case where platinum was employed, the heat treatment was conducted at the temperature of 300° C. for one hour; in the case where palladium was employed, the heat treatment was conducted at the temperature of 400° C. for one hour. The thickness of the second silicon oxide film comprising platinum by means of the X-ray photo-electron spectrum. The thickness of the second silicon oxide film comprising palladium was employed was measured by means of the capacitance-voltage (C-V) measurement.

Figure 9:
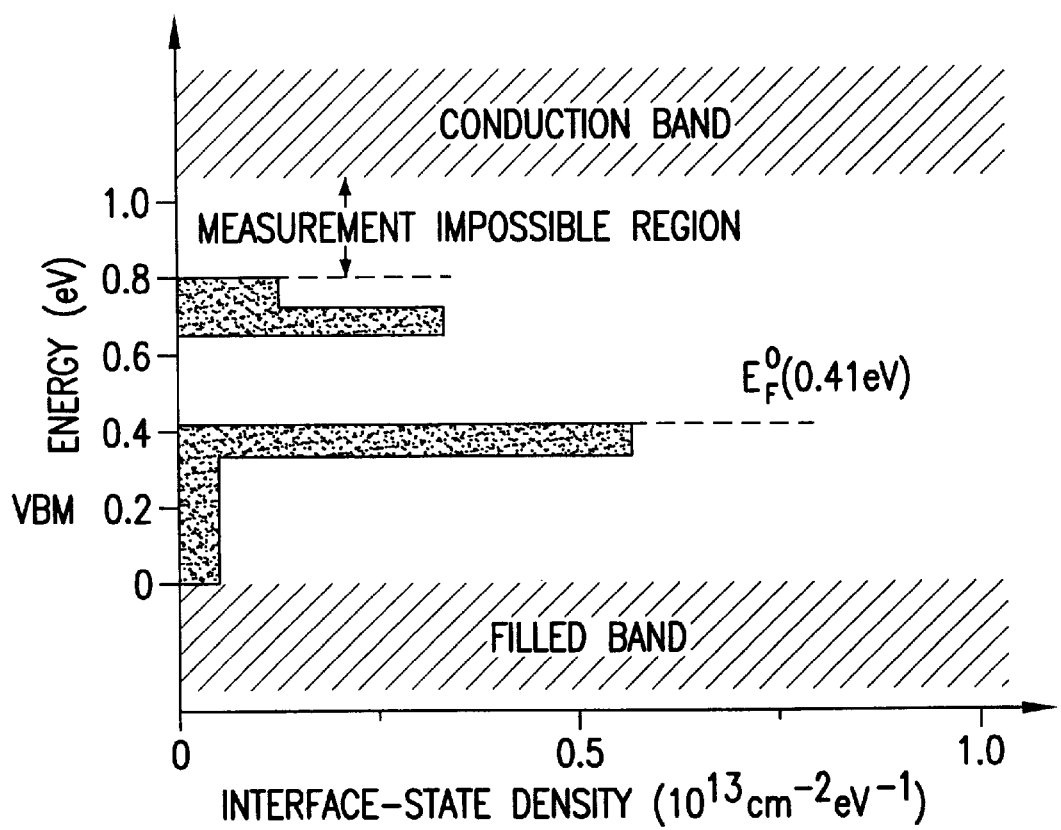
FIG. 9 shows a distribution chart of the interface-state density of oxide film formed in one example of the present invention.

FIG. 9 shows the energy distribution of the interface-state density of the semiconductor having a structure of 3 nm of platinum/2.6 nm of oxide film/Si substrate of the present invention. The energy distribution of interface-state of a MOS device having an ultra thin oxide film of 2.6 nm thickness cannot be measured by the conventional electric measurement such as capacitance-voltage (C-V) measurement or conductance-voltage (G-V) measurement. An X-ray photo electron spectrum was measured when the bias voltage was applied. (H. KOBAYASHI, Y. YAMASHITA, T. MORI, Y. NAKATO, K. H. PARK, Y. NISHIOKA, Surface Science (Surf. Sci.) Vol.326 (1995), page 124; H. KOBAYASHI, T. MDRI, K. NAMBA, Y. NAKATO, Solid State Comom. Vol.92 (1994), page 249).

In the oxidation treatment of the present invention, no heat treatment was conducted after chemical oxide film (1.1 nm) was formed by means of the heated concentrated nitric acid. At this time, the interface-state was distributed around the mid-gap, and the dangling bond of Si was thought to have an interaction with Si and oxygen atoms in an oxide film of this example. The interface-state density of oxide film turned out to be lower than that of the oxide film having a thickness of 3 nm formed at a temperature of 550° C. or the oxide film having a thickness of 3.5 nm formed by the wet oxidation at a temperature of 700° C. This shows the oxide film formed by the method of this example has sufficient interface characteristics as a gate oxide film. Therefore, the thin oxide film formed by the method of this example is useful for an MOS transistor or the ultra thin gate oxide film of MOS capacitor. The oxide film formed by the method of the present invention can be employed not only for gate oxide films but also for various uses.

Figure 10:
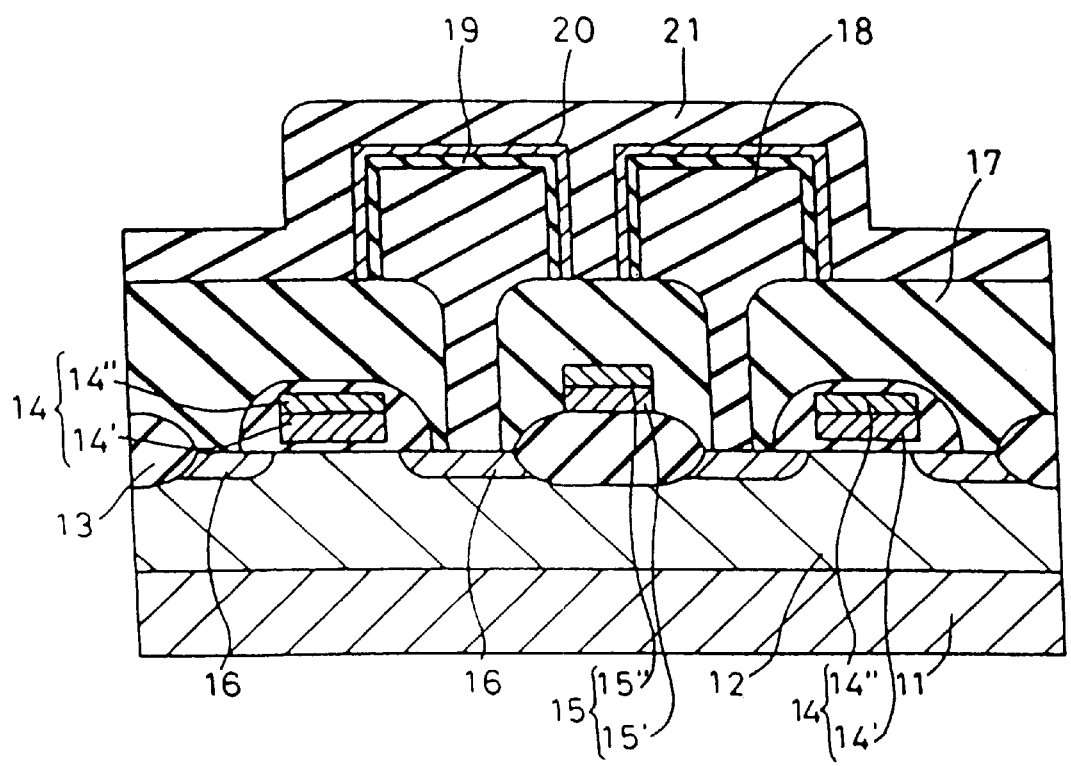
FIG. 10 is a cross sectional view showing an application example of oxide film to the dielectric film of the DRAM capacitance dielectric film.

FIG. 10 shows an application example of a cell capacitance which is a stacked capacitance of dynamic random access memory (DRAM) to the present invention. Generally, a capacitance electrode which is called storage node 18 is formed by a amorphous silicon containing $1\times10^{20}$ atoms/ $cm^3$ of conductive impurities such as phosphorus. In a case where heated oxide films or the like were formed on these storage nodes, grains of amorphous silicon film grow while generating a stress. Thus, the characteristics of dielectric breakdown of a capacitance dielectric film formed on the storage node deteriorated. However, grain growth of amorphous silicon was not observed to occur during the growth of oxide films at a low temperature of not higher than 400° C., so that the ultra thin capacitance oxide film 19 having the thickness of 2–4 nm can be formed with high controllability. In this case, the structure of the cell capacitance is, amorphous silicon storage node 18/low-temperature oxide film 19/platinum thin film 20/amorphous silicon cell plate 21. Herein, providing the platinum thin film 20 makes it possible to prevent the depletion on the cell plate and to secure the cell capacitance. Moreover, oxide films were formed on the monocrystalline silicon substrate or amorphous silicon substrate so that the capacitance of structure between conductive films can be obtained. In FIG. 10; 11 is a p-type silicon substrate, 12 is a p-type well region, 13 is a separation region, 14 is a selection transistor (polycide gate), 14' is a polycrystalline silicon film, 14" is a tungsten silicide ($WSi_x$) film, 15 is a bit line (polycide), 15' is a polycrystalline silicon film, 15" is a tungsten silicide ($WSi_x$) film, 16 is a source drain $n^{30}$ diffused layer, and 17 is a layer insulation film.

Figure 11:
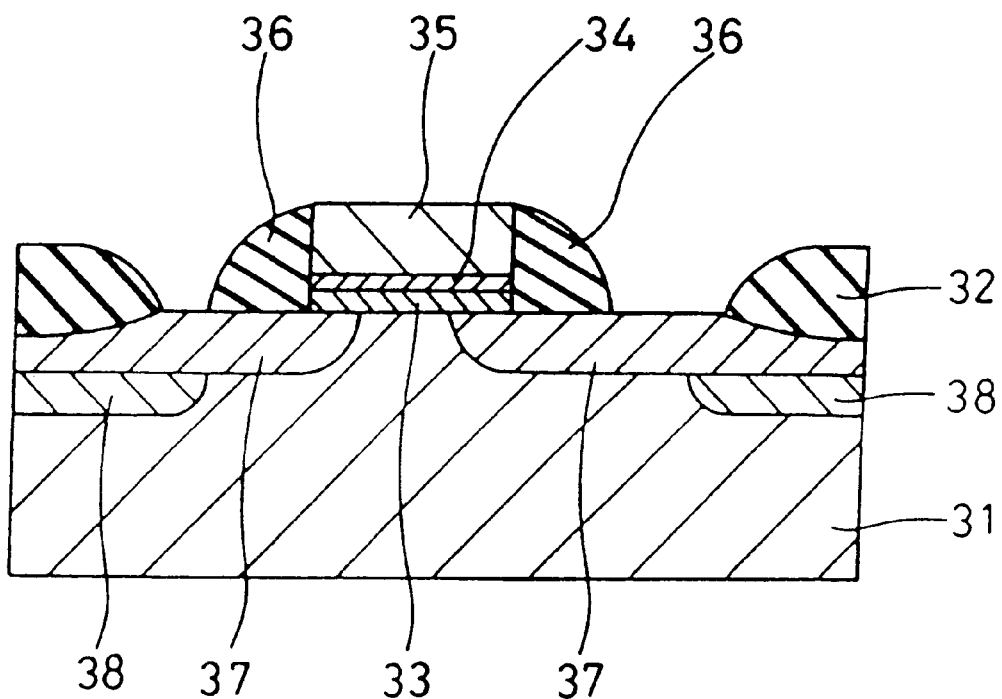
FIG. 11 is a cross sectional view showing an application example of oxide film to an MOS transistor.

FIG. 11 is an application example where the oxide film of the present invention was employed for MOS transistor. An element separation region was formed on the p-type substrate and then for controlling the threshold voltage, boron ions were implantated onto the active region so as to be made a density of $1\times10^{18}$ atoms/cm$^3$. Then, the wafer surface was cleaned and the native oxide films were removed by etching with anhydrous HF gas for approximately 10 seconds. Subsequently, an oxide film having the thickness of 1 nm was formed on the surface of the silicon by exposing the silicon substrate in ozone gas. Then, platinum film 34 having the thickness of 3 nm was deposited by the sputtering method and heat treated at a temperature of 100° C. in a moistening oxygen for one hour so that the gate oxide film 33 having the .thickness of 2.2 nm was formed. Then, the polysilicon film 35 was formed to a 100 nm thickness by the well known CVD method under reduced pressure at a temperature of 530° C. The deposited film of this example was amorphous and the phosophorus density was $3\times10^{20}$ atoms/cm$^3$. In addition, the gate electrode was patterned by the well known photo-lithographic method, and etching of no crystalline silicon 35/platinum 34/gate oxide film 33 was conducted by the well known dry etching method. Then, phosophorus-doped oxide film was deposited as a sidewall 36. Moreover, source drain 38 was formed by ion implantation after sidewall etching was conducted. Moreover, by employing the low temperature method like the present invention, a MOS transistor could be formed after a metal wiring process was conducted. In FIG. 11; 31 is a p-type silicon substrate, 32 is a p-type well region, 37 is a source drain LDD diffused layer, and 38 is a source drain n$^+$diffused film layer.

As stated above, in the example of the present invention, a semiconductor substrate was observed to be oxidation treated at a temperature from the room temperature (25° C.) to 400° C.

As stated above, the semiconductor of the present invention comprises at least an oxide film and a metal thin film. And the metal thin film comprises the metal serving as an oxidation catalyst and has a thickness in the range of 0.5–30 nm. On the other hand, the oxide film comprises a metal serving as an oxidation catalyst and having a thickness in the range of 1-20 nm. Thus, a high-quality oxide film can be formed on the surface of the semiconductor substrate with high controllability without conducting a high temperature heat treatment. Moreover, the semiconductor can be formed, on which a gate oxide film can be firmed after metal wiring is placed.

The method for manufacturing an oxide film on the surface the semiconductor of the present invention comprises the steps of: forming the first oxide film having a thickness in the range of 0.1–2.5 nm on the semiconductor substrate; forming a metal thin film serving as an oxide catalyst and having a thickness in the range of 1-30 nm on the first oxide film; and forming the second oxide film by heat treating in an atmosphere of oxidation at temperatures of not higher than 600° C. As a result, a thin and homogeneous oxide film can be formed on the semiconductor efficiently and reasonably. The oxide films formed by the method of the present invention also have a high quality and high controllability.

According to a more preferable method for manufacturing an oxide film of the present invention, without exposing the semiconductor substrate under the high temperature of not less than 600° C., ultra thin oxide films which are excellent in interface characteristics can be formed with high producibility. In other words, the heat history is not necessary to be considered. Moreover, like this invention, by applying the method for forming the oxide film to the surface of the polycrystalline silicon substrate and noncrystalline silicon substrate, a high performance capacitance can be made. Furthermore, since oxidation is conducted under low temperature, MOS transistors can be formed after the metal wiring is placed on the semiconductor substrate, thus improving the flexibilities in design and process of manufacturing devices as well as the performance of the semiconductor.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, and all changes which come within the meaning and range of equivalency of the claims are intended to be embraced therein.

What is claimed is:

1. A method for manufacturing an oxide film on the surface of a semiconductor substrate, comprising:

forming a first oxide film on the semiconductor substrate;

forming a metal thin film serving as an oxidation catalyst and having a thickness in the range of 0.5–30 nm on the first oxide film; and forming a second oxide film between the first oxide film and the metal thin film by heating the set conductor substrate in an oxidizing atmosphere at a temperature of not higher than 600° C., whereby the metal thin film catalyzes oxidation of the first oxide film to form the second oxide film.

2. The method for manufacturing an oxide film on the surface of the semiconductor substrate according to claim 1 wherein the first oxide film is manufactured by soaking the semiconductor substrate in at least one solution selected from the group consisting of a heated solution containing concentrated nitric acid, a heated solution containing concentrated sulfuric acid and hydrogen peroxide, a heated solution containing hydrochloric acid and hydrogen peroxide, a solution containing hydrogen peroxide, a solution containing ozone, a heated solution containing nitric acid and sulfuric acid, a solution containing hydrofluoric acid, boiling water, and a heated solution containing ammonium hydride solution an hydrogen peroxide.

3. The method for manufacturing an oxide film on the surface of the semiconductor substrate according to claim 1, wherein the first oxide film is formed either by exposing the semiconductor substrate in ozone gas or by exposing the semiconductor substrate in ozone gas with ultraviolet irradiation.

4. The method for manufacturing an oxide film on the surface of the semiconductor substrate according to claim 1, wherein the metal thin film comprises at least one material selected from the group consisting of platinum and palladium.

5. The method for manufacturing an oxide film on the surface of the semiconductor substrate according to claim 1, wherein the metal thin film is formed by a deposition method.

6. The method for manufacturing an oxide film on the surface of the semiconductor substrate according to claim 1, wherein the heat treatment is conducted in an oxidizing atmosphere selected from the group consisting of an atmosphere of dry oxygen, an atmosphere of mixed gas of dry oxygen and non-oxidizing gas, an atmosphere of oxygen containing water vapor, an atmosphere of mixed gas of oxygen containing water vapor and non-oxidizing gas, an atmosphere of containing ozone gas, an atmosphere of oxygen containing $N_2O$, and an atmosphere of oxygen containing NO.

7. The method for manufacturing an oxide film on the surface of the semiconductor substrate according to claim 1, wherein the temperature of the heat treatment is in the range of 25–600° C.

8. The method for manufacturing an oxide film on the surface of the semiconductor substrate according to claim 1, wherein the semiconductor substrate comprises at least one material selected from the group consisting of single crystalline silicon, polycrystalline silicon, amorphous silicon, gallium arsenide and indium phosphide.

9. The method for manufacturing an oxide film on the surface of the semiconductor substrate according to claim 1, further comprising removing native oxide films and/or impurities which are present on the surface of the semiconductor substrate before the oxide films are formed.

10. The method for manufacturing an oxide film on the surface of a semiconductor substrate according to claim, wherein the thickness of the second oxide film ranges from 1 to 20 nm.

11. The method for manufacturing an oxide film on the surface of the semiconductor substrate according to claim 1, wherein the heat treatment in an oxidizing atmosphere is conducted after metal wiring is made on the surface of the semiconductor substrate.

12. A method for manufacturing an oxide film on the surface of the semiconductor substrate according to claim 1, wherein the first oxide film having a thickness in the range of 0.1–2.5 nm.

13. A method for manufacturing an oxide film on the surface of the semiconductor substrate according to claim 7, wherein the second oxide film by heat treating the metal thin film in an oxidizing atmosphere at the temperature in the range of 25–400° C.

14. A method for manufacturing a MOS semiconductor device, comprising:

forming a first oxide film having a thickness in the range of 0.1–2.5 nm on the semiconductor substrate;

forming a metal thin film serving as an oxidation catalyst and having a thickness in the range of 0.5–30 nm on said first oxide film;

forming a second oxide film between the first oxide film and the metal thin film by heating the semiconductor substrate in an oxidizing atmosphere at a temperature of not higher than 600° C., whereby the metal thin film catalyzes oxidation of the first oxide film to form the second oxide film; and forming an electrode on the metal thin film.

* * * * *